(12) United States Patent
Rapp et al.

(10) Patent No.: US 11,899,074 B2
(45) Date of Patent: Feb. 13, 2024

(54) SENSOR ARRANGEMENT AND A METHOD FOR MONITORING A STORAGE SYSTEM

(71) Applicant: KNORR-BREMSE Systeme fuer Nutzfahrzeuge GmbH, Munich (DE)

(72) Inventors: Tamas Rapp, Budapest (HU); Benedek Pour, Budapest (HU); Huba Nemeth, Budapest (HU)

(73) Assignee: KNORR-BREMSE Systeme fuer Nutzfahrzeuge GmbH, Munich (DE)

( * ) Notice: Subject to any disclaimer, the term of this patent is extended or adjusted under 35 U.S.C. 154(b) by 500 days.

(21) Appl. No.: 17/277,216

(22) PCT Filed: Sep. 4, 2019

(86) PCT No.: PCT/EP2019/073596
§ 371 (c)(1),
(2) Date: Mar. 17, 2021

(87) PCT Pub. No.: WO2020/057978
PCT Pub. Date: Mar. 26, 2020

(65) Prior Publication Data
US 2022/0026502 A1 Jan. 27, 2022

(30) Foreign Application Priority Data
Sep. 18, 2018 (EP) .................... 18195075

(51) Int. Cl.
*G01R 31/396* (2019.01)
*B60L 58/12* (2019.01)
*H02J 7/00* (2006.01)

(52) U.S. Cl.
CPC ............ *G01R 31/396* (2019.01); *B60L 58/12* (2019.02); *H02J 7/0016* (2013.01); *H02J 7/0018* (2013.01)

(58) Field of Classification Search
USPC ....................................................... 320/132
See application file for complete search history.

(56) References Cited

U.S. PATENT DOCUMENTS

| 2003/0020334 A1 | 1/2003 | Nozu |
| 2008/0018300 A1 | 1/2008 | Zaag et al. |

(Continued)

FOREIGN PATENT DOCUMENTS

| AU | 2017272188 B2 | 7/2018 |
| CN | 101165507 A | 4/2008 |

(Continued)

OTHER PUBLICATIONS

International Search Report (PCT/ISA/210) issued in PCT Application No. PCT/EP2019/073596 dated Dec. 12, 2019 (three (3) pages).

(Continued)

*Primary Examiner* — Mohammed Alam
(74) *Attorney, Agent, or Firm* — Crowell & Moring LLP

(57) ABSTRACT

A sensor arrangement for a vehicle storage system for electric energy is disclosed. The vehicle storage system includes a plurality of storage units for electric energy that are connected in series between a reference voltage node and a first or a second output terminal to provide electric energy to at least one consumer at the first or at the second output terminal. The sensor arrangement has a plurality of sensor units configured to determine charging levels of the storage units by measuring at least one of the following quantities: one or more voltages between reference voltage node and a node between adjacent storage units, one or more voltage drops over at least a subset of the storage units, electric currents though the first and/or through second output terminal, or temperatures of the storage units.

10 Claims, 1 Drawing Sheet

(56) References Cited

U.S. PATENT DOCUMENTS

| | | | |
|---|---|---|---|
| 2009/0198399 A1 | 8/2009 | Kubo et al. | |
| 2010/0001737 A1 | 1/2010 | Kubo et al. | |
| 2010/0136390 A1* | 6/2010 | Ueda | H01M 10/441 |
| | | | 429/61 |
| 2012/0306468 A1 | 12/2012 | Butzmann et al. | |
| 2013/0026989 A1* | 1/2013 | Gibbs | B60L 53/14 |
| | | | 320/116 |
| 2013/0057198 A1 | 3/2013 | Gerlovin | |
| 2013/0063094 A1* | 3/2013 | Gibbs | B60L 50/66 |
| | | | 320/134 |
| 2014/0097787 A1 | 4/2014 | Lin | |
| 2014/0183939 A1 | 7/2014 | Jiang et al. | |
| 2014/0266222 A1 | 9/2014 | Baughman | |
| 2014/0333315 A1 | 11/2014 | Yamamoto | |
| 2014/0350878 A1 | 11/2014 | Ohnuki | |
| 2014/0361743 A1 | 12/2014 | Lin et al. | |
| 2015/0321576 A1 | 11/2015 | Lee | |
| 2016/0291114 A1 | 10/2016 | Bacquet | |
| 2016/0372940 A1* | 12/2016 | Canadi | H02J 7/0047 |
| 2017/0072811 A1 | 3/2017 | Tabatowski-Bush et al. | |
| 2017/0214256 A1 | 7/2017 | Hardy | |
| 2018/0093569 A1 | 4/2018 | Takao et al. | |
| 2018/0164363 A1 | 6/2018 | Brorein et al. | |
| 2018/0175633 A1 | 6/2018 | Kaminsky | |
| 2018/0241226 A1 | 8/2018 | Sugimura | |
| 2022/0026502 A1* | 1/2022 | Rapp | H02J 7/0048 |

FOREIGN PATENT DOCUMENTS

| | | | |
|---|---|---|---|
| CN | 101499672 A | 8/2009 | |
| CN | 101529646 A | 9/2009 | |
| CN | 102652387 A | 8/2012 | |
| CN | 102769313 A | 11/2012 | |
| CN | 102969755 A | 3/2013 | |
| CN | 103931076 A | 7/2014 | |
| CN | 104237795 A | 12/2014 | |
| CN | 204479719 U | 7/2015 | |
| CN | 104853949 A | 8/2015 | |
| CN | 105083037 A | 11/2015 | |
| CN | 106160239 A | 11/2016 | |
| CN | 106537718 A | 3/2017 | |
| CN | 106926715 A | 7/2017 | |
| CN | 108226786 A | 6/2018 | |
| DE | 10 2014 102 667 A1 | 9/2014 | |
| DE | 10 2015 219 828 A1 | 4/2017 | |
| EP | 2 085 784 A2 | 8/2009 | |
| JP | 2003-32908 A | 1/2003 | |
| JP | 2009-42071 A | 2/2009 | |
| JP | 2009-183025 A | 8/2009 | |
| JP | 5839047 B2 | 1/2016 | |
| JP | 2016-121967 A | 7/2016 | |
| JP | 2017-96628 A | 6/2017 | |
| WO | WO 2013/038762 A1 | 3/2013 | |
| WO | WO 2013/094214 A1 | 6/2013 | |
| WO | WO 2016/053385 A1 | 4/2016 | |
| WO | WO 2016/174828 A1 | 11/2016 | |

OTHER PUBLICATIONS

Written Opinion (PCT/ISA/237) issued in PCT Application No. PCT/EP2019/073596 dated Dec. 12, 2019 (six (6) pages).

Extended European Search Report issued in European Application No. 18195075.9 dated Mar. 19, 2019 (seven (7) pages).

Chinese-language Office Action issued in Chinese Application No. 201980061052.0 dated Mar. 20, 2023 with English translation (18 pages).

Korean-language Office Action issued in Korean Application No. 10-2021-7010908 dated Nov. 12, 2022 with English translation (eight (8) pages).

Japanese-language Office Action issued in Japanese Application No. 2021-538909 dated May 9, 2022 with English translation (26 pages).

Japanese-language Office Action issued in Japanese Application No. 2021-538909 dated Jan. 24, 2023 with English translation (eight (8) pages).

* cited by examiner

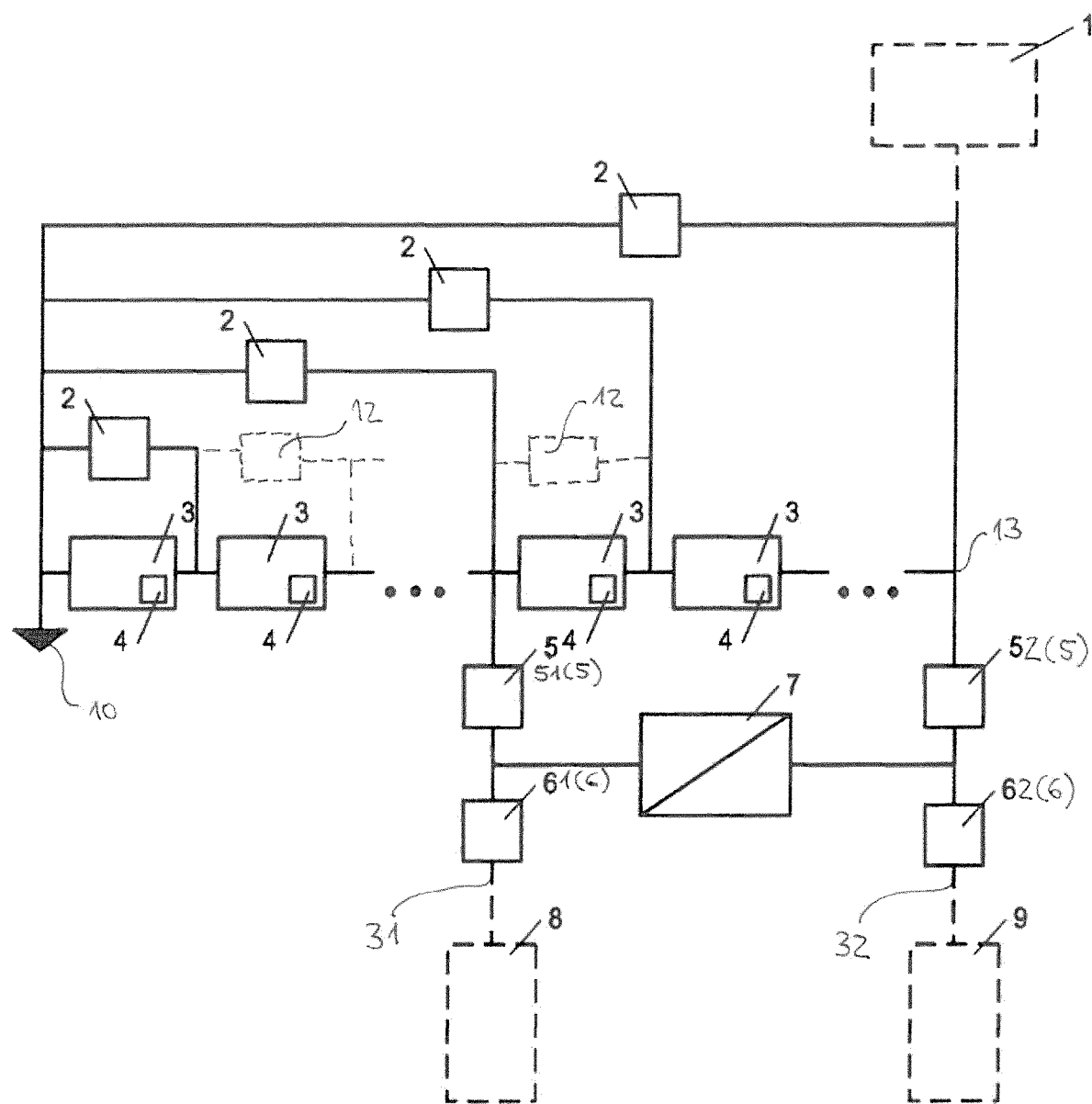

SENSOR ARRANGEMENT AND A METHOD FOR MONITORING A STORAGE SYSTEM

BACKGROUND AND SUMMARY OF THE INVENTION

The present invention relates to a sensor arrangement for a (redundant) electric energy management system and to a method for monitoring the electric energy storage system and, in particular, to sensors for a safety relevant electric energy storage system.

In recent times more and more vehicle components are replaced by electrically powered components—even for safety critical functions such as braking or steering, in particular in combination with autonomous driving. However, safety critical systems need a redundant power management system on a high safety level. An obvious solution thereto is to create redundant equipment including the electric energy storage circuits (e.g. by doubling all components). This is, however, not always possible or desired. In addition, the management of batteries raises various further problems due to their electro-chemical behavior.

A conventional electric energy storage system is disclosed in US 2018/241226, wherein buffer amplifiers are connected to a given battery cell and the voltage is measured differentially by further amplifiers. Another conventional monitoring system is disclosed in AU 2017/272188, wherein measurement units determine a voltage drop over a subset of the storage units. However, these conventional systems involve many components and do not provide a redundant management as needed for automotive applications.

Therefore, there is a demand for other sensor arrangements which are suitable for an electric energy storage system that provides the redundancy needed for safety applications in the automotive sector.

At least some of these problems are overcome by a sensor arrangement and a method according to independent claims. The dependent claims refer to further advantageous realizations of the subject matter of the independent claims.

Embodiments of the present invention relate to a sensor arrangement for a vehicle storage system for electric energy. The vehicle storage system comprises a plurality of storage units for electric energy that are connected in series between a reference voltage node and first and/or a second output terminal to provide electric energy to at least one consumer at the first or at the second output terminal. The sensor arrangement comprises a plurality of sensor units configured to determine charging levels of the storage units by measuring at least one of the following quantities:
  one or more voltages between reference voltage node and a node between adjacent storage units,
  one or more voltage drops over at least a subset of the storage units,
  electric currents though the first and/or through second output terminal,
  temperatures of at least some of the storage units.

It is understood that the sensor arrangement according to embodiments of the present invention merely needs to be suitable to be integrated into the defined vehicle storage system, which itself may or may not be part of the sensor arrangement. The reference voltage node may or may not be a ground node.

The defined voltages/currents/temperatures may be measured directly or may be derived from other quantities. Therefore, the sensor units may comprise voltage sensors arranged between the reference voltage node and a node between adjacent storage units. Similarly, the sensor units may comprise further voltage sensors arranged in parallel to the subset of the storage units. The further voltage sensors may be or may include operational amplifiers. Operational amplifiers are particularly suited for this application, because they provide an effective voltage measurement while consuming only little of the valuable energy.

The vehicle storage system may further comprise at least one charge balancing unit configured to provide a current path between the first output terminals and the second output terminal or a current path that is parallel to at least one of the storage units. Then, the sensor units may comprise at least one pair of current sensors arranged in series between the first or the second output terminal and the storage units, wherein the balancing unit couples to a node between the two current sensors to enable current measurements through the first or second output terminal and through the charge balancing unit. The balancing unit is adapted to balance different levels of the state of charge. Such battery balancing increases the available capacity and longevity of the storage unit. Optionally, the at least one pair of current sensors comprise a first pair of current sensors connected to the first output terminal and second pair of current sensors connected to the second output terminal. The balancing unit couples to nodes between the two current sensors of the first pair and the two current sensors of the second pair.

Optionally, the sensor units include one or more temperature sensors formed in or on the storage units to measure the temperatures of one or more storage units Optionally, the sensor units are adapted to provide redundant measurements for at least one of the following:
  voltage over one or more storage units,
  electric currents through the output terminals and/or through a charge balancing unit,
  temperatures of one or more storage units.

In the simplest case, these redundant measurements can be achieved by doubling of some or all sensors.

Embodiments of the present invention relate also to a redundant electric energy storage system for a vehicle, in particular for commercial vehicles. The energy storage system comprises a plurality of storage units for electric energy that are connected in series between a reference voltage node and first or a second output terminal to provide electric energy to at least one consumer at to the first or at the second output terminal, and a sensor arrangement as defined before.

Further embodiments of the present invention relate to a vehicle, in particular to a commercial vehicle, with a redundant electric energy storage system as defined before.

Further embodiments relate to a method of monitoring a state of a storage system for electric energy with a plurality of serially connected storage units, at least a first and a second output terminal, a charge balancing unit for providing a current path between the first and the second output terminal (parallel to one or more storage units). The method comprises measuring at least one of the following quantities:
  one or more voltages between the reference voltage node and a node between adjacent storage units of the serially connected storage units,
  one or more voltage drops over at least a subset of the storage units,
  electric currents though the first and/or the second output terminal and/or through the charge balancing unit,
  temperatures of the storage units.

This method or part thereof may also be implemented in software or a computer program product and the order of steps may not be important to achieve the desired effect. Embodiments of the present invention can, in particular, be implemented or caused by software or a software module in an ECU or to a computer program having a program code for causing to perform the steps of the method, when the computer program is executed on a processor.

Embodiments of the present invention are advantageous over the conventional systems, since they provide a complete monitoring system that measures all signals and provides a detailed state of the storage system (batteries, capacitors, or other storage elements). In addition, embodiments are further able to take all needed measurements to estimate the state of the electric energy storages. In particular, the monitoring of the voltage levels is carried out in combination with the possibility of monitoring the loading and charge balancing currents at any time and at each electric energy storage.

Some examples of the systems and/or methods will be described in the following by way of examples only, and with respect to the accompanying figure.

BRIEF DESCRIPTION OF THE DRAWING

FIG. 1 depicts a sensor arrangement for the redundant electric energy storage system according to an embodiment of the present invention.

DETAILED DESCRIPTION OF THE DRAWING

FIG. 1 depicts a sensor arrangement for the (redundant) electric energy storage system according to an embodiment of the present invention. The arrangement comprises a plurality of voltage sensors 2 arranged between the contacts of the storage units 3 (e.g. the positive contacts) and a reference voltage node 10 (e.g. ground). When ground is assigned to the negative contact, the voltage sensors 2 are connected between ground and the respective positive contacts of the storage units 3, but the polarity can also be switched. The storage units 3 may be battery cells or any other kind of storage elements that are connected in series between the exemplary ground terminal 10 and an end node 13. Hence, the plurality of voltage sensors 2 are provided between neighboring battery cells 3 and the ground terminal 10 and thus measure the voltage level between adjacent battery cells 3 compared to ground (or any other reference voltage). The power can be supplied by a vehicle power and communication network 1 that is, e.g., connected with the end node 13. The management of the storage system can be implemented through this network 1.

According to the depicted embodiment, further voltage sensors 12 are arranged in parallel to one or more of the battery cells 3 to measure directly the voltage drop(s) over the one or more battery cells 3.

The storage system further comprises a first and a second output terminal 31, 32 for consumers 8, 9 such as vehicle components (e.g. actuators for braking or steering) that are to be supplied with power. Current sensors 5, 6 are provided in a serial connection to one or more nodes between adjacent battery cells 3 (or at the end node 13) to measure currents to the exemplary consumers 8, 9. In the depicted embodiment a first pair of current sensors 51, 61 is provided in serial connection between the first output terminal 31 and the battery cells 3 (a node between two of the battery cells 3). In addition, a second pair of current sensors 52, 62 is provided in serial connection between the second output terminals 32 and the end node 13 of battery cells 3.

Furthermore, a (active) charge balancing circuit 7 is provided at nodes between the two serial current sensors 5, 6 to provide a current path between the first output terminal 31 and the second output terminal 32 and to enable a charge balancing between both output terminals 31, 32. The current sensors 5, 6 are thus able to measure the currents to each consumer 8, 9 and, in addition, through the charge balancer 7.

In addition, each or some of the battery cells 3 comprises an optional temperature sensor 4 to measure the temperature of the respective battery cell(s) 3. The temperature sensors 4 may be integrated in the battery cells 3 or provided on a surface of the battery cells. 3

Embodiments of the present invention provide the following advantages.

The electric energy storage management is able to monitor the status of the storage system at any time, which is important especially for safety relevant consumers 8, 9. This monitoring of the batteries can typically not be provided by direct measurements, but so-called state observers are to be evaluated. This evaluation can be done based different electrochemical models for the batteries that need a number of quantities as input to determine the state of the electric energy storage.

A first quantity to be measured is the output voltage of the batteries which is measured according to embodiments by the voltage sensors 2 arranged between reference voltage node 10 and nodes between adjacent battery cells 3. Therefore, embodiments do not necessarily measure directly the output voltage of a given battery cell, but only the serial voltages over a subset or all of the battery cells. The individual voltage drops over given battery cells can finally be obtained by a subtraction of two or more voltage measurements using the voltage sensors 2. Alternatively, it is also possible to determine differential voltages directly on each battery by using, for example, operational amplifiers as further voltage sensors 12.

A second quantity used for the electrochemical model relates to a measured load current(s), wherein according to embodiments two current measurement units 6 are arranged upstream from the exemplary two consumers 8, 9. In addition to the load current, also the charge currents can be measured by these current sensors 5, 6. The other two current measuring modules 5 are located at an end point of the active charge balancing unit 7 and can be used to measure all load related currents.

A third quantity used for the electrochemical model is the temperature(s) of the electric energy storages 3 measured for each or some battery cells 3 by dedicated temperature sensors 4, for example, mounted on a surface or connected to the electric output poles of the respective battery cells 3.

Optionally, it is also possible to arrange all sensors redundantly (in the simplest case by doubling all sensors) in order to obtain a monitoring also for safety relevant consumers so that even if one or some of the sensors fails, a reliable result can still be obtained.

Further advantageous embodiments relate to the following subject matters:
  A sensor arrangement for a redundant electric energy management system, especially for commercial vehicles, wherein the electric energy storage voltages are measured between positive nodes of serial coupled batteries (cells or battery packs) and the ground (final values may be calculated by subtraction);
  A sensor arrangement for redundant electric energy management system, especially for commercial vehicles, wherein the electric energy storage voltages are measured differentially between negative and positive nodes of serial coupled batteries (cells or battery packs);

The sensor arrangements as defined before, wherein the consumer related currents are measured by two current sensors 5, 6 in each circuit, up- and downstream to the active charge balancing unit 7 (therefore, all currents from loading and active balancing can be calculated);

The sensor arrangement as defined before, wherein the monitoring is completed with energy storage temperature sensors (which are surface mounted or connected to output poles);

The sensor arrangement as defined before, wherein the above sensors are arranged redundantly, e.g. by doubling sensors for the same measurement.

The description and drawing merely illustrate the principles of the disclosure. It will thus be appreciated that those skilled in the art will be able to devise various arrangements that, although not explicitly described or shown herein, embody the principles of the disclosure and are included within its scope.

Furthermore, while each embodiment may stand on its own as a separate example, it is to be noted that in other embodiments the defined features can be combined differently, i.e. a particular feature descripted in one embodiment may also be realized in other embodiments. Such combinations are covered by the disclosure herein unless it is stated that a specific combination is not intended.

LIST OF REFERENCE SIGNS 1 vehicle power and/or communication network
2 voltage sensors
3 storage units
4 temperature sensors
5, 6 current sensors
7 charge balancing unit
8, 9 consumers (vehicle components)
10 reference voltage node (e.g. ground)
12 further voltage sensors (e.g. operational amplifiers)
13 end node
31,32 output terminal(s)

The invention claimed is:

1. A sensor arrangement for a vehicle storage system for electric energy, the vehicle storage system comprising a plurality of storage units for electric energy that are connected in series between a reference voltage node and a first or a second output terminal to provide electric energy to at least one consumer at the first or at the second output terminal, comprising:
a plurality of sensor units configured to determine charging levels of the storage units by measuring at least one of the following quantities:
(i) one or more voltages between reference voltage node and a node between adjacent storage units,
(ii) one or more voltage drops over at least a subset of the storage units,
(iii) electric currents though the first and/or through second output terminal, or
(iv) temperatures of the storage units;
wherein:
the vehicle storage system further comprises at least one charge balancing unit configured to provide a current path between the first output terminal and the second output terminal, the current path being parallel to at least one of the storage units;
the sensor units comprise at least one pair of current sensors arranged in series between the first or the second output terminal and the storage units, and the balancing unit couples to a node between the two current sensors to enable current measurements through the first or second output terminal and through the charge balancing unit.

2. The sensor arrangement according to claim 1, wherein the sensor units comprise voltage sensors arranged between the reference voltage node and a node between adjacent storage units.

3. The sensor arrangement according to claim 2, wherein the sensor units comprise further voltage sensors arranged in parallel to the subset of the storage units.

4. The sensor arrangement according to claim 3, wherein the further voltage sensors are operational amplifiers.

5. The sensor arrangement according to claim 1, wherein the at least one pair of current sensors comprise a first pair of current sensors and a second pair of current sensors so that the balancing unit couples to nodes between the two current sensors of the first pair and between the two current sensors of the second pair.

6. The sensor arrangement according to claim 1, wherein the plurality of sensor units include temperature sensors formed in or on the storage units.

7. The sensor arrangement according to claim 1, wherein the plurality of sensor units are adapted to provide redundant measurements for at least one of the following:
(i) voltage over one or more storage units,
(ii) electric currents through the output terminals and/or through a charge balancing unit, or
(iii) temperatures of one or more storage units.

8. A redundant electric energy storage system, comprising:
a plurality of storage units for electric energy that are connected in series between a reference voltage node and a first or a second output terminal to provide electric energy to at least one consumer at the first or at the second output terminal, and
a sensor arrangement comprising:
a plurality of sensor units configured to determine charging levels of the storage units by measuring at least one of the following quantities:
(i) one or more voltages between reference voltage node and a node between adjacent storage units,
(ii) one or more voltage drops over at least a subset of the storage units,
(iii) electric currents though the first and/or through second output terminal, or
(iv) temperatures of the storage units;
wherein:
the vehicle storage system further comprises at least one charge balancing unit configured to provide a current path between the first output terminal and the second output terminal, the current path being parallel to at least one of the storage units;
the sensor units comprise at least one pair of current sensors arranged in series between the first or the second output terminal and the storage units, and the balancing unit couples to a node between the two current sensors to enable current measurements through the first or second output terminal and through the charge balancing unit.

9. A commercial vehicle, comprising a redundant electric energy storage system of claim 8.

10. A method of monitoring a state of a storage system for electric energy, the method comprising:
providing a storage system having a plurality of serially connected storage units, at least a first and a second output terminal, and a charge balancing unit for providing a current path between the first and the second output terminal; and measuring at least one of the following quantities:
(i) one or more voltages between a reference voltage node and a node between adjacent storage units of the serially connected storage units,
(ii) one or more voltage drops over at least a subset of the storage units,
(iii) electric currents though the first and/or the second output terminal, or
(iv) temperatures of the storage units;

wherein:
the vehicle storage system further comprises at least one charge balancing unit configured to provide a current path between the first output terminal and the second output terminal, the current path being parallel to at least one of the storage units;
the sensor units comprise at least one pair of current sensors arranged in series between the first or the second output terminal and the storage units, and the balancing unit couples to a node between the two current sensors to enable current measurements through the first or second output terminal and through the charge balancing unit.

* * * * *